United States Patent [19]
Kurtz et al.

[11] Patent Number: 5,686,826
[45] Date of Patent: Nov. 11, 1997

[54] AMBIENT TEMPERATURE COMPENSATION FOR SEMICONDUCTOR TRANSDUCER STRUCTURES

[75] Inventors: Anthony D. Kurtz, Teaneck; Wolf S. Landmann, Leonia, both of N.J.

[73] Assignee: Kulite Semiconductor Products, Leonia, N.J.

[21] Appl. No.: 617,502

[22] Filed: Mar. 15, 1996

[51] Int. Cl.$^6$ .............................. H03H 2/00; H03F 3/26
[52] U.S. Cl. ............................................. 323/365; 330/146
[58] Field of Search .............................. 323/365, 367, 323/368; 73/721, 727; 330/146

[56] References Cited

U.S. PATENT DOCUMENTS

| | | | |
|---|---|---|---|
| 3,568,044 | 3/1971 | Elazar | 323/365 |
| 3,651,696 | 3/1972 | Rose | 323/365 |
| 3,831,042 | 8/1974 | La Claire | 307/310 |
| 4,171,509 | 10/1979 | Stephens et al. | 323/365 |
| 4,192,005 | 3/1980 | Kurtz . | |
| 4,333,349 | 6/1982 | Mallon et al. . | |
| 4,419,620 | 12/1983 | Kurtz et al. | 323/367 |
| 4,476,726 | 10/1984 | Kurtz et al. . | |
| 4,611,163 | 9/1986 | Madeley | 323/367 |
| 5,053,692 | 10/1991 | Craddock | 323/365 |
| 5,398,194 | 3/1995 | Brosh et al. . | |

*Primary Examiner*—Peter S. Wong
*Assistant Examiner*—Bao Q. Vu
*Attorney, Agent, or Firm*—Plevy & Associates

[57] ABSTRACT

The present compensating circuit operates to reduce the span shift error due to ambient temperature changes of a span resistance compensated, bridge array circuit arrangement for a semiconductor transducer employing piezoresistive sensors. The span resistance method alone cannot reduce the span shift error to less than one percent (1%) for full scale. The present compensating circuit applies a constant voltage source, derived from the voltage source applied to the transducer, to a non-inverting input to an operational amplifier. The circuit also applies an ambient temperature dependent voltage, derived from the ambient temperature dependent bridge resistance of the bridge array circuit, to an inverting input of the operational amplifier. Both inputs to the operational amplifier are fed back through a different resistance loop to control the output voltage in response to the non-linearity of the ambient temperature dependent bridge resistance. The present circuit produces a compensation voltage which counteracts the downward span shift influence of the bridge resistance, resulting in a span shift error of less than five tenths of a percent (0.5%) for full scale.

19 Claims, 3 Drawing Sheets

AMBIENT TEMPERATURE COMPENSATION FOR SEMICONDUCTOR TRANSDUCER STRUCTURES

FIELD OF THE INVENTION

This invention relates to integrated circuit semiconductor transducer structures in general and more particularly to a circuit for reducing the span shift of a transducer having a non-linear, ambient temperature dependent response.

BACKGROUND OF THE INVENTION

The prior art discloses pressure measuring devices such as semiconductor types which are fabricated from piezoresistive sensors integrally diffused within a diaphragm of semiconducting material such as silicon. Such devices are fabricated using solid state techniques which basically involve the diffusion or deposition of a force sensitive arrangement of piezoresistors on a semiconductor diaphragm. The integral silicon transducers are conventionally formed in a four active arm Wheatstone bridge configuration providing an output proportional to pressure and/or deflection. The stress sensors or piezoresistors are typically arranged so that two elements of the four are subjected to tension and two are subjected to compression. This type of arrangement has been referred to in the prior art as an integral or integrated transducer and the terminology is used to denote the fact that the piezoresistive sensing elements are actually deposited, diffused or otherwise formed on a semiconductor substrate employing fabrication techniques used in integrated circuit technology.

The transducer configuration as a half bridge array or a full Wheatstone bridge array is widely employed and is an extremely typical arrangement. As a result of the applied pressure, the output of the bridge, when supplied with a constant direct current (DC) or alternating current (AC) voltage, is proportional to the pressure.

It has long been known, however, that the output of such a bridge will generally decrease with increasing temperature because of the basic temperature variation of the piezoresistive coefficient of the semiconductor. This is commonly referred to as the span or sensitivity shift. By using degenerately doped semiconductors, the temperature variation can be reduced from about 20% per 100° F. in lightly doped silicon to about 1% to 2% per 100° F. in the degenerate case. In order to obtain even less temperature variation in the output, various compensation methods must be employed. These make use of the fact that the temperature coefficient of resistance of the bridge elements are positive and are greater in magnitude than the decrease with temperature of the piezoresistive coefficient. Thus, if a resistor is connected in series with the bridge and the resulting circuit is powered with a constant voltage, the voltage across the bridge will increase as a function of temperature and an output more independent of temperature will result. Such a method is disclosed in U.S. Pat. No. 4,419,620, entitled "Linearizing Circuits For A Semiconductor Pressure Transducer", issued to Kurtz et al. As the temperature of the bridge is increased, its resistance increases and more of the supply is dropped across the bridge. By proper choice of the ratio of the series resistor (commonly referred to as a span resistor) to the bridge resistance, the requisite increase in bridge voltage with temperature required to compensate for the decrease in piezoresistive coefficient may be obtained and bridge voltage output can be made more independent of temperature. Additionally, a combination of resistors in series with and or in parallel with the bridge can be used.

A major advantage of this compensation scheme is that the temperature sensing element, the piezoresistive element, is the very element subjected to the varying temperature, while the resistor or resistors used in the compensation configuration are constant with temperature (fixed resistors). As a result, the correction provided by this method is practically instantaneous, and not subject to temperature gradients, time constants, etc. However, a major shortcoming of this compensation method is its inability to consistently improve the accuracy or reduce the span shift to less than one percent (1%), even with the most degenerate semiconductors over a large temperature excursion. Two limitations which affect this accuracy are that the decrease in the piezoresistive coefficient is not linear with temperature, increasing in absolute value at high temperature, and the compensation itself is non-linear with temperature due to the factor $R_{BRIDGE}/(R_{SPAN}+R_{BRIDGE})$ which itself is non-linear with temperature. Assuming $R_{SPAN}$ is constant and $R_{BRIDGE}$ increases linearly with temperature, this correction factor is decreasing with temperature, providing less compensation exactly where more compensation is needed. As a result, transducers compensated this way can achieve a close to perfect stability of the output from extreme cold to about eighty degrees centigrade (80° C.), and about minus two percent to minus three percent (−2% to −3%) error at elevated temperatures (125° C. to 150° C.). One common method for overcoming such non-linearity uses a thermistor in the circuit, usually across the span resistor. For that case the span resistor is divided into two resistors and a thermistor with an additional resistor used to shunt one of the span resistors. Moreover, this technique defeats the main advantage of having the piezoresistive bridge itself as the only temperature dependent component. In addition, it requires considerable effort to tailor the new resistor-thermistor network to obtain the correct non-linearity correction.

Accordingly, it is an object of the present invention to disclose a method for improving the compensation for the non-linear, ambient temperature dependent response of semiconductor transducers, in a rapid and efficient manner.

SUMMARY OF THE INVENTION

The present invention is a circuit for improving the span resistance method of compensating for an ambient temperature dependent, non-linear response of a semiconductor transducer employing a bridge array circuit arrangement. The transducer has input terminals connected to the span resistance which in turn is connected to a voltage source and output terminals for providing a transducer output voltage. The circuit for improving the non-linear response includes an operational amplifier having an inverting input terminal, a non-inverting input terminal, an output terminal, and an operating bias from an independent source potential.

A negative feedback loop is coupled at one terminal to the output terminal of the amplifier and at the other terminal to the inverting input terminal of the amplifier and between the span resistance and the bridge array. A positive feedback loop is coupled at one terminal to the output terminal of the amplifier and at the other terminal to the non-inverting input terminal and a biasing voltage divider circuit.

The biasing voltage dividing circuit which provides a constant voltage source to the non-inverting input to the amplifier is derived from the voltage supply to the bridge array through the span resistance. A first resistor and a second resistor are connected together and connected to the non-inverting input and the positive feedback loop. The other terminal of the first resistance is connected between the span resistance and the voltage supply, while the other terminal of the second resistor connected to ground.

As the ambient temperature increases, the bridge resistance operates to cause an increasing non-linear deviation or span shift downward from a true linear response, in the method employing a lone span resistance which is temperature independent, and the span shift cannot be reduced to less than several percent (1%) of full scale over an extended temperature range. The present invention provides a non-linear increase in the bridge voltage which makes possible the compensation of the transducer circuit to less than several tenths of a percent over the same temperature range. The negative feedback loop to the amplifier operates to influence when the amplifier output voltage from the amplifier becomes positive, thereby providing a linearly increasing feedback voltage to the bridge once the amplifier is positively biased. One set of resistors is used to set the temperature at which the amplifier is positively biased and another set of resistors is used to define the slope of the feedback voltage as a function of temperature.

BRIEF DESCRIPTION OF THE DRAWINGS

The invention will be better understood with reference to the following illustrative and non-limiting drawings, in which.

DETAILED DESCRIPTION OF THE INVENTION

Although the present invention can be used in different applications where a temperature compensation is desirable, the present invention is especially suited for improving the accuracy of piezoresistive type pressure transducers employing a span resistor to compensate for an ambient temperature dependant response. Accordingly, the present invention will be described in conjunction with improving the accuracy of piezoresistive type transducers using a span resistance to compensate for ambient temperature induced errors.

A known technique of using a fixed resistor, known as a span resistor, to reduce the temperature dependency of the span output of the transducer fails to improve the accuracy to less than a few percent of full scale.

Figure 1:
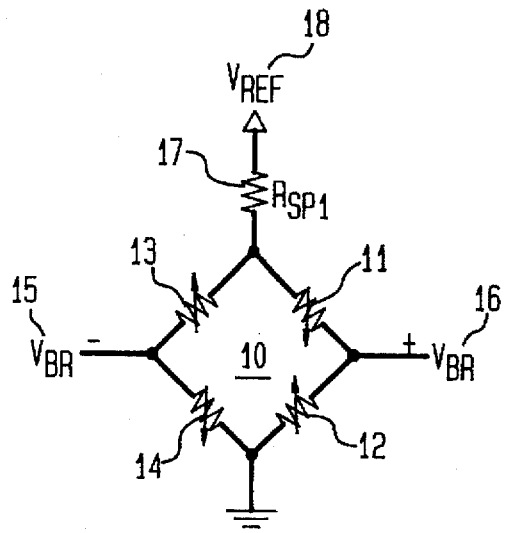
FIG. 1 is a circuit schematic of a known compensation method using a span resistor to compensate for a non linear response induced by ambient temperatures.

There is shown in FIG. 1, with like elements like numbered or designated in all Figures, the known circuit for reducing the effect caused by ambient temperature variations of a full Wheatstone bridge array 10. The bridge array 10 includes resistors 11 and 12 on the compression sensitive arm and resistors 13 and 14 on the tension arm. The supply voltage 18, designated as $V_{REF}$, for the bridge is generated by a voltage regulator so as to remain constant with changing ambient temperatures. As noted above, the optimal value of the span resistor 17 ($R_{SP1}$) is determined by the temperature coefficient of the resistance (TCR) and the temperature coefficient of the gage factor (TCGF). This method requires that the TCGF, in absolute value, to be smaller than the TCR.

Figure 2:
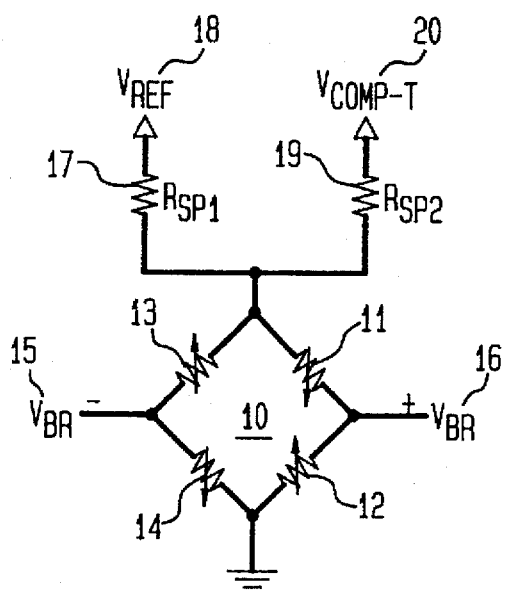
FIG. 2 is a partial circuit schematic of the present method for compensating for ambient temperature.

The present method replaces the span resistor circuit of FIG. 1 with the whole circuit shown in FIG. 2, which includes a parallel combination of resistors 17 ($R_{SP1}$) and 19 ($R_{SP2}$) in which resistor 19 ($R_{SP2}$) is "k" times larger than resistor 17 ($R_{SP1}$). The purpose of this circuit is to compensate the temperature dependency of the transducer output in a manner similar to the single span resistor for temperatures up to a certain point (corner temperature) and to provide an additional increase of the bridge voltage past the corner temperature. This mode of operation is accomplished by having the output of the operational amplifier ($V_{COMP-T}$) being zero (or constant) up to the corner temperature and linearly increasing with temperature thereafter.

To understand the operation of the circuit it may be useful to reduce it to the Thevenin equivalent. To do so the circuit is first reduced to the circuit shown in FIG. 2. The Thevenin equivalent circuit is then in fact identical to the circuit in FIG. 1 for temperatures less than the corner temperatures. For temperatures in excess of this value the regulated voltage $V_{REF}$ is not constant anymore but linearly increasing with temperature, thereby providing the additional compensation required to reduce the temperature dependency of the transducer's output.

To achieve the intended function, the circuit amplifies the temperature dependent voltage at the junction between the pressure sensor and the span resistor. Due to the offset provided by resistors $R_2$ and $R_3$, the output of the amplifier should theoretically be negative for temperatures less than the corner temperature. However, because the operational amplifier is provided only with a positive supply voltage, the output is clamped to zero (or a small saturation voltage) for temperatures less than the corner temperature and linearly increasing thereafter. The corner temperature is determined by the resistors $R_2$ and $R_3$, and the slope of the temperature dependent voltage $V_{COMP-T}$ is determined by $R_5$.

Figure 6:
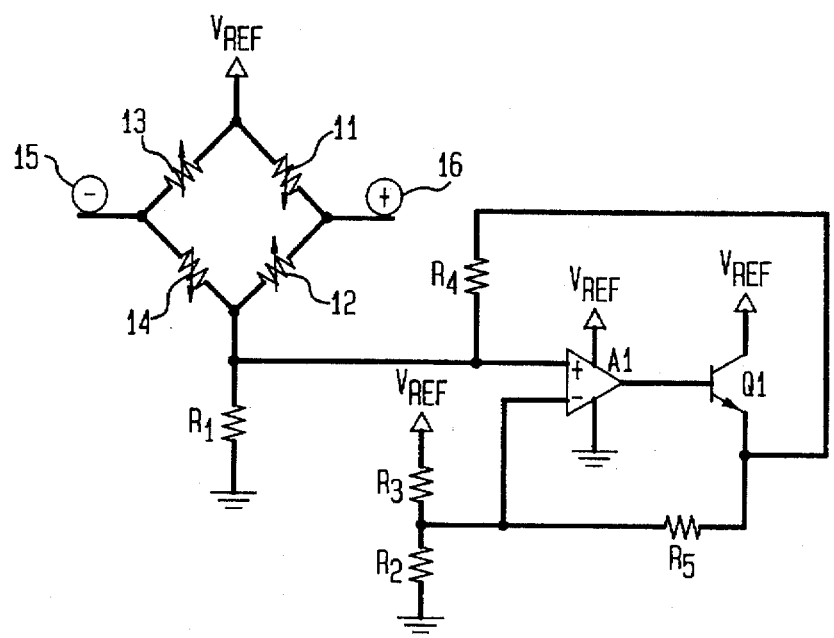
FIG. 6 is a practical implementation of a temperature compensating ciruit showing the current buffer transistor $Q_1$.

Practical considerations may require addition of a transistor $Q_1$, as shown in FIG. 6, in order to increase the current drive capability of the operational amplifier. The transistor $Q_1$ is not required however, for bridge resistances of about 2000 ohms ($\Omega$) or more.

Figure 7:
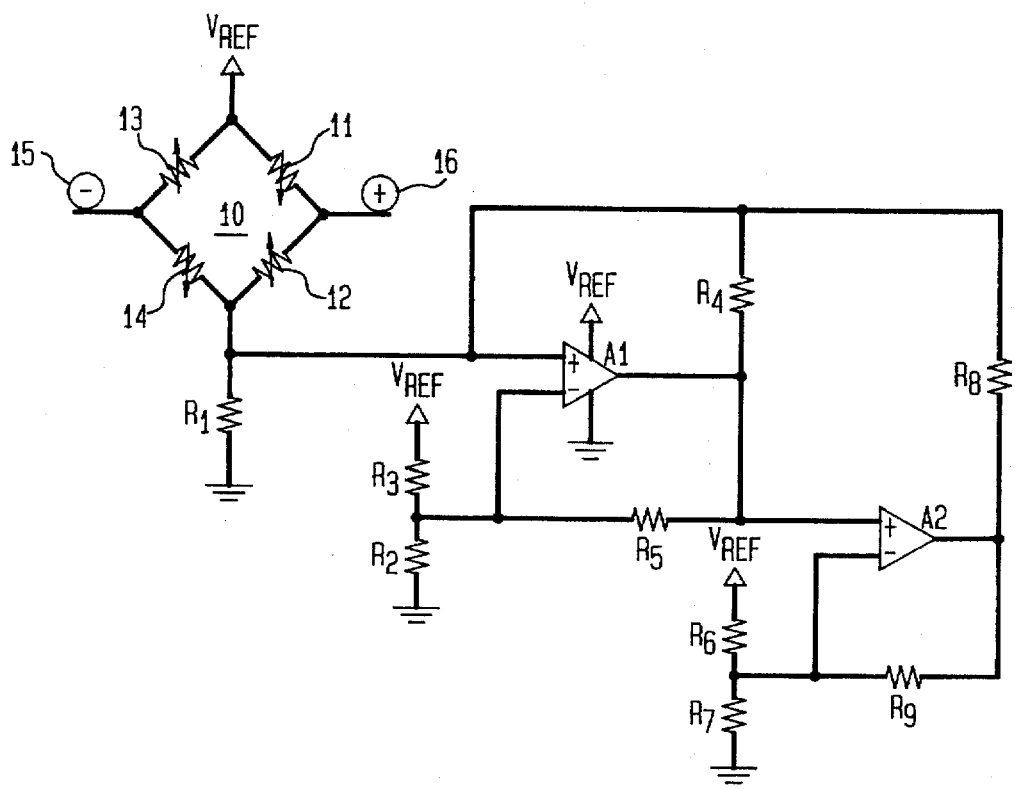
FIG. 7 shows a polynomial compensation circuit in accordance with the present invention.

The performance of the circuit can be further enhanced by adding a second amplifier stage, as shown in FIG. 7, with a second operational amplifier $A_2$ and resistors $R_6$, $R_7$, $R_8$, and $R_9$, thereby generating a compensation made of three (3) linear segments: a constant or zero compensation up to a first corner temperature, followed by a moderate slope up to a second corner temperature and a subsequent higher slope for temperatures in excess of the second corner temperature.

Figure 4:
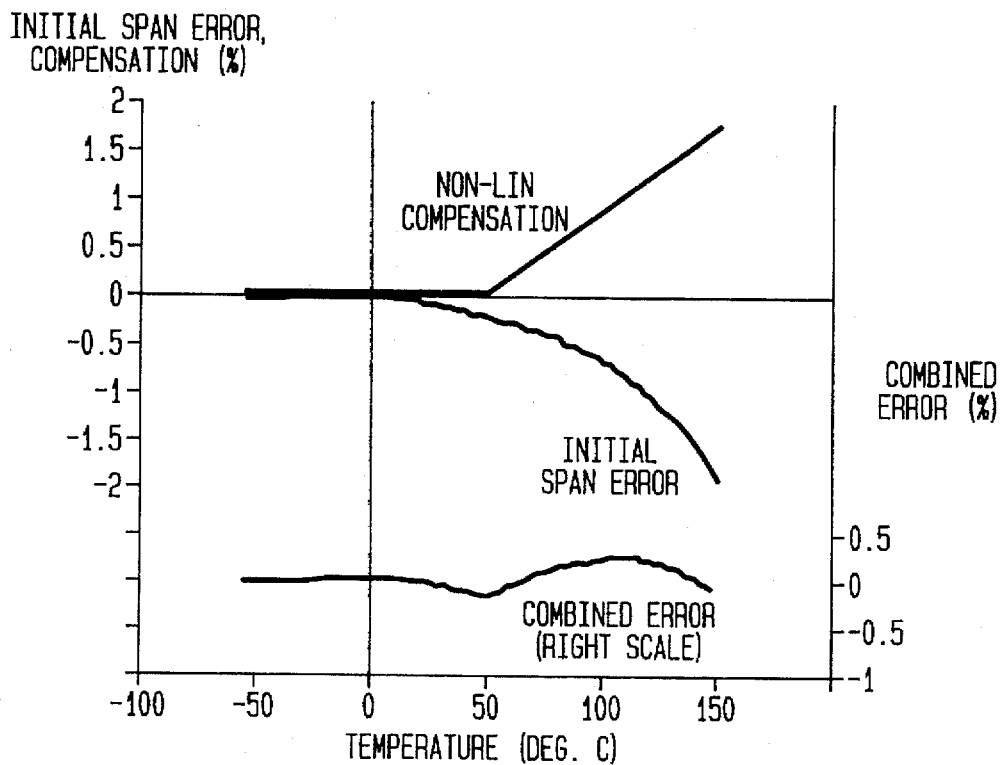
FIG. 4 is a graph comparing temperature compensation errors with and without the present method.

The increasing non-linear change provided by the compensation voltage 20 ($V_{COMP-T}$) applied to resistor 19 ($R_{SP2}$) in the circuit of FIG. 2 counteracts the decreasing non-linear change of the lone span resistor 17 ($R_{SP1}$) in the circuit of FIG. 1. Referring now to the graph of FIG. 4, the curve labelled "initial span error" depicts the percent error for the traditional SPAN resistor compensation method of FIG. 1 in a typical transducer. The curve labelled "Non-lin compensation" shows the effect induced by the compensation voltage 20 ($V_{COMP-T}$) applied to the parallel resistor 19 ($R_{SP2}$). The combined effects of the increasing compensation percent error induced by the compensation voltage 20 ($V_{COMP-T}$) and the decreasing percent error for the traditional lone span resistor results in the more linear response depicted by the curve labelled (combined error), wherein the maximum percent error is less than plus minus half a percent (±0.5%).

Figure 3:
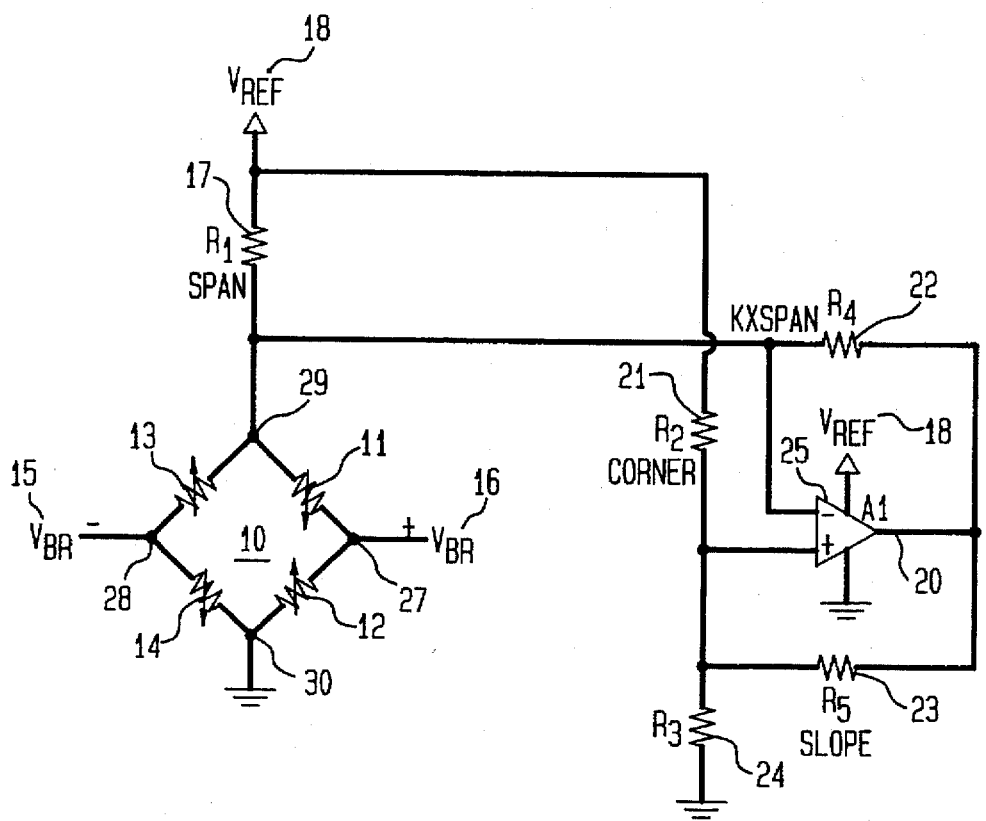
FIG. 3 is a complete schematic of the present method for improving the accuracy of a span resistance method for overcoming errors induced by ambient temperature variations.

The complete schematic of FIG. 3 shows how the advantage of the known method of single span resistor of deriving the compensation voltage from the changing resistance of the bridge versus ambient temperature, is preserved in the proposed circuit. The operational amplifier 25 has an inverting input (−) and a non-inverting input (+). Examples of suitable operational amplifiers are well known in the art. Essentially, an operational amplifier is a high gain device and many suitable amplifiers are commercially available. The operating characteristics of such amplifiers as 25 are well understood.

The amplifier 25 receives its supply voltage from the same source 18 as the piezoresistive bridge. The amplifier 25 has its inverting input coupled to the bridge 10 at terminal 28. Coupled to the inverting input of the amplifier 25 and the bridge 10 at terminal 28 is resistor 22, designated as $R_4$ (k x span), which is connected at its other terminal to the output of the amplifier 25. Coupled to the inverting input of the amplifier 25, resistor 22, and terminal 28 of the bridge 10 is the span resistor 17 which is connected at its other terminal to the supply voltage 18 ($V_{REF}$). The amplifier has its non-inverting input coupled to resistor 21, designated as $R_2$ (corner), resistor 23, designated as $R_5$ (slope), and resistor 24, designated as $R_3$. The other terminal of resistor 21 is connected to the other terminal of resistor 17 and the supply voltage 18. The other terminal of resistor 23 is connected to the output of the amplifier 25 and the other terminal of resistor 22. The other terminal of resistor 24 is grounded. The full bridge array elements being like numbered in FIG. 1 and FIG. 2 are the same elements described above.

The notable advantage of the circuit in FIG. 3 stems from the compensation voltage, discussed in conjunction with FIG. 2, being derived from the changing resistance of the bridge 10 versus temperature, therefore retaining the advantages of the traditional method. More specifically, the circuit of FIG. 3 takes advantage of the temperature dependent voltage across the bridge 10 between terminals 29 and 30, due to the typical ten percent (10%) per fifty five degree centigrade (55° C.) temperature coefficient of the bridge 10 resistance. The voltage across terminals 29 and 30 is applied to the inverting input of the amplifier 25. The non-inverting input is biased with a constant voltage derived from the supply voltage 18 through resistors 21 (R2) and 24 (R3). Theoretically, the output of the amplifier 25 varies with temperature from a negative value at the extreme lower temperature to a positive value at the higher temperature. Because the amplifier 25 is only supplied with a positive voltage its output cannot be a negative voltage.

Figure 5:
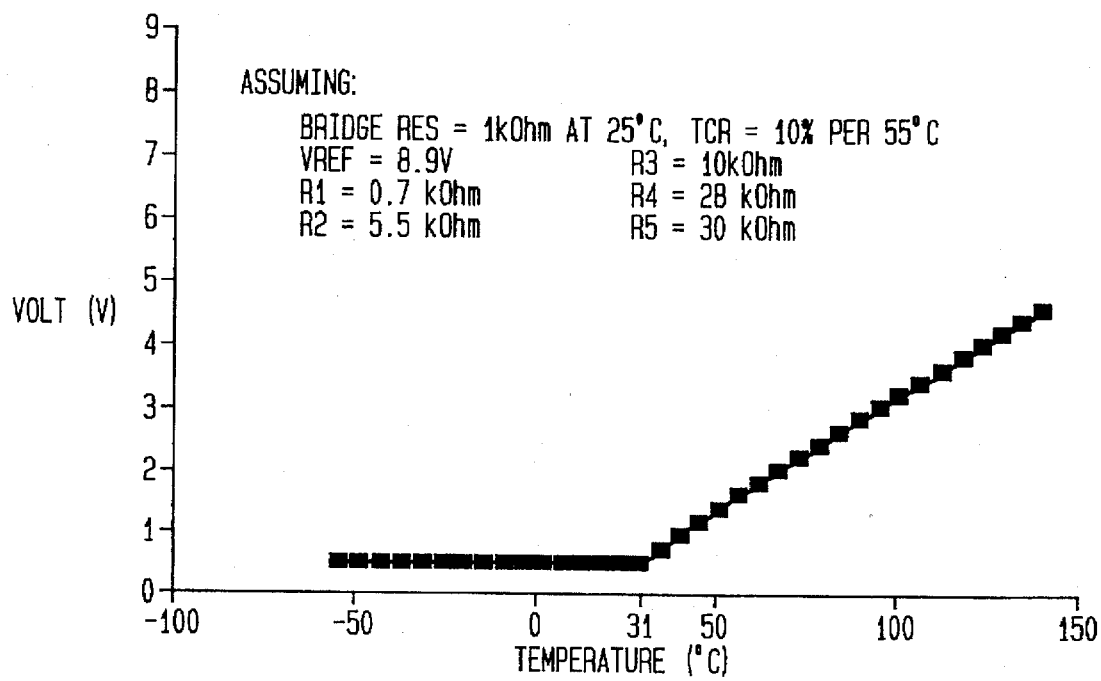
FIG. 5 is graph of an amplifier output voltage versus changing ambient temperature with under the present invention.

Referring now to FIG. 5 there is shown the actual voltage output of the amplifier 25 as a function of changing ambient temperature. The graph is based on the known dependency of the bridge resistance versus temperature, one kilo-ohm at twenty five degrees centigrade (1 kΩ at 25° C.) with a temperature compensation ratio (TCR) of ten percent per 55 degrees centigrade (10% per 55° C.). The corner temperature 31 is adjusted to the optimum value by means of changing one of the resistors 21 ($R_2$) or 24 ($R_3$). The slope of the output for temperatures above the corner temperature 31 is adjusted by means of the negative feedback resistor 23 ($R_5$, slope). It is noted that the circuit has a positive feedback loop through resistor 22 ($R_4$, kxSPAN). For stability the negative feedback has to be less than the positive feedback. The formula relating the output voltage to the value of the components in the circuit is:

$$V_{COMP-T} = V_{REF} \frac{R_1 R_2 R_5 (R_{BRIDGE} + R_4) - R_{BRIDGE} R_2 R_4 (R_3 + R_5)}{R_{BRIDGE} R_1 R_5 (R_2 + R_3) - R_2 R_3 R_4 (R_{BRIDGE} + R_1)}$$

It should be understood that the embodiment described herein is merely exemplary and that a person skilled in the art may make many variations and modifications to this embodiment utilizing functionally equivalent elements to those described herein. Any and all such variations or modifications as well as others which may become apparent to those skilled in the art, are intended to be included within the scope of the invention as defined by the appended claims.

We claim:

1. In a pressure transducer apparatus containing one or more piezoresistive elements formed by an integrated circuit technique arranged in a bridge array on a force responsive member having a span resistance element connected between a source of biasing potential and a terminal of said bridge array and means for providing an additional voltage as a function of temperature from a separate source and output terminals for providing a transducer output voltage, said bridge array having an ambient temperature dependent bridge resistance operative to influence a non-linear response in said transducer output voltage, in combination therewith the improvement comprising:

compensating means for producing a compensation voltage responsive to said ambient temperature dependent resistance of said bridge array; and, input means coupling said compensating means with said bridge array and said span resistance element for counteracting said ambient temperature dependent bridge resistance to linearize said non-linear response in said transducer output voltage;

wherein said compensation means includes an amplifier, negative feedback means and positive feedback means, said amplifier having an inverting input terminal, a non-inverting input terminal, an output terminal, and an operating bias from an independent source potential, said negative feedback means having a first end coupled to said output terminal of said amplifier and a second end coupled to said terminal of said bridge array and said inverting input terminal of said amplifier, and said positive feedback means having a first end coupled to said output terminal of said amplifier and a second end coupled to said span resistance element and said non-inverting input terminal of said amplifier.

2. The combination according to claim 1, wherein said compensation means includes an amplifier having an inverting input terminal, a non-inverting input terminal, an output terminal, and an operating bias from an independent source potential, negative feedback means coupled at one terminal to said output terminal and at the other terminal to said inverting input terminal and between said span resistance and said bridge array, and positive feedback means coupled at one terminal to said output terminal and at the other terminal to said non-inverting input terminal and said input means.

3. The combination of claim 1, wherein said input means includes means for biasing said inverting input terminal with a constant source potential derived from said source of biasing potential of said transducer apparatus.

4. The combination according to claim 1, wherein said means for biasing of said input means includes a voltage divider circuit with a first resistor and a second resistor each having a first terminal connected together and connected to said non-inverting input and said positive feedback, other terminal of said first resistance connected between said span resistance and said source of biasing potential, other terminal of said second resistor connected to ground.

5. The combination according to claim 1, wherein said amplifier is an operational amplifier.

6. The combination according to claim 1, wherein said positive feedback means is a resistor.

7. The combination according to claim 1, wherein said negative feedback means is a resistor.

8. An ambient temperature compensating apparatus for a transducer of the type employing a conventional Wheatstone bridge array having first and second input terminals for applying a source of biasing potential therebetween and first and second output terminals for obtaining a transducer output voltage therebetween and a span resistance connected between said Wheatstone bridge array and a source of biasing potential, said Wheatstone bridge array having an ambient temperature dependent bridge resistance operative to influence an undesirable non-linear response in said transducer output voltage, said ambient temperature compensating apparatus operative to counteract said ambient temperature dependent bridge resistance, comprising:

amplifier means for amplifying an ambient temperature dependant voltage derived from said ambient temperature dependent resistance of said Wheatstone bridge array to produce an amplifier voltage output;

positive feedback means coupled to said amplifier means for influencing slope of said amplifier voltage output;

negative feedback means coupled to said amplifier means for influencing when said amplifier voltage output is positive; and, input means for applying said ambient temperature dependant voltage to said amplifier means and coupling said amplifier voltage output to said Wheatstone bridge array and said span resistance so as to counteract said ambient temperature dependent bridge resistance, said input means coupling said amplifier means with said Wheatstone bridge and said span resistance.

9. The apparatus of claim 8, wherein said amplifier means includes an inverting input terminal, a non-inverting input terminal, an output terminal, and an operating bias from an independent source potential.

10. The apparatus of claim 9, wherein said negative feedback means is coupled at one terminal to said output terminal and at the other terminal to said inverting input terminal and between said span resistance and said bridge array.

11. The apparatus of claim 10, wherein said positive feedback means is coupled at one terminal to said output terminal and at the other terminal to said non-inverting input terminal and said input means, a potential from said positive feedback means being greater than a potential from said negative feedback means, said positive feedback means operative to influence the slope of said amplifier output voltage.

12. The apparatus of claim 11, wherein said input means includes a voltage divider circuit with a first resistor and a second resistor each having a first terminal connected together and connected to said non-inverting input and said positive feedback, other terminal of said first resistance connected between said span resistance and said source of biasing potential, other terminal of said second resistor connected to ground.

13. The apparatus of claim 12, wherein said amplifier means is an operational amplifier.

14. The apparatus of claim 12, wherein said positive feedback means and said negative feedback means each include a resistor.

15. A method for improving the span shift response of a transducer employing the span resistor method of compensating for an ambient temperature dependent bridge array circuit arrangement, comprising the steps of:

deriving an ambient temperature dependent voltage from said bridge array circuit arrangement;

applying said ambient temperature dependent voltage as an input to an inverted input terminal of an amplifier to produce an amplifier voltage output;

coupling a constant voltage source derived from said source potential applied to said span resistance to a non-inverted input terminal of said amplifier;

feeding back a portion of said amplifier voltage output to said non-inverted input terminal of said amplifier through a positive feedback loop;

feeding back a portion of said amplifier voltage output to said inverted input terminal of said amplifier through a negative feedback loop;

producing a compensating voltage from said amplifier output voltage when a potential said positive feedback loop is greater than a potential from said negative feedback loop; and, coupling said compensating voltage with said ambient temperature dependent bridge array circuit arrangement for reducing said span shift response of said transducer.

16. The method of claim 15, wherein said amplifier is an operational amplifier with an operating bias from an independent source potential.

17. The method of claim 16, wherein said negative feedback loop is a resistor coupled at one terminal to said output terminal and at the other terminal to said inverting input terminal and between said span resistance and said bridge array, said negative feedback loop operative to influence when said amplifier output voltage becomes positive.

18. The method of claim 17, wherein said positive feedback loop is a resistor coupled at one terminal to said output terminal and at the other terminal to said non-inverting input terminal and said input means, said positive feedback loop operative to influence the slope of said compensation voltage.

19. The method of claim 18, wherein said step of coupling a constant voltage source is with a voltage divider circuit with a first resistor and a second resistor each having a first terminal connected together and connected to said non-inverting input and said positive feedback, other terminal of said first resistance connected between said span resistance and said source of biasing potential and other terminal of said second resistor connected to ground.

* * * * *